(12) United States Patent
Ito et al.

(10) Patent No.: US 11,770,013 B2
(45) Date of Patent: Sep. 26, 2023

(54) STAND FOR CHARGER

(71) Applicant: Kubota Corporation, Osaka (JP)

(72) Inventors: Hirokazu Ito, Sakai (JP); Tomohiko Hisakuni, Sakai (JP)

(73) Assignee: Kubota Corporation, Osaka (JP)

( * ) Notice: Subject to any disclaimer, the term of this patent is extended or adjusted under 35 U.S.C. 154(b) by 0 days.

(21) Appl. No.: 17/337,848

(22) Filed: Jun. 3, 2021

(65) Prior Publication Data
US 2022/0224132 A1 Jul. 14, 2022

(30) Foreign Application Priority Data
Jan. 12, 2021 (JP) ................................. 2021-002845

(51) Int. Cl.
*F16M 11/00* (2006.01)
*H02J 7/00* (2006.01)
*F16M 13/02* (2006.01)
*H05K 5/02* (2006.01)

(52) U.S. Cl.
CPC ........... *H02J 7/0042* (2013.01); *F16M 13/02* (2013.01); *H05K 5/023* (2013.01)

(58) Field of Classification Search
CPC ........ F16M 13/02; H05K 5/023; H02J 7/0042
See application file for complete search history.

(56) References Cited

U.S. PATENT DOCUMENTS

| | | | |
|---|---|---|---|
| D227,680 S * | 7/1973 | Fischer | D10/77 |
| 5,011,031 A * | 4/1991 | Konstant | A47B 47/027 |
| | | | 211/192 |
| 5,083,076 A * | 1/1992 | Scott | H02J 7/0029 |
| | | | 320/DIG. 15 |
| 5,295,591 A * | 3/1994 | Slater | A47B 47/027 |
| | | | 211/151 |
| 7,622,890 B2 * | 11/2009 | Krampitz | H02J 7/0048 |
| | | | 324/426 |
| 8,450,970 B1 * | 5/2013 | Drinkwater | H02J 7/0044 |
| | | | 320/108 |
| 10,274,124 B2 * | 4/2019 | Gilmore | F16M 1/08 |
| 10,432,001 B1 * | 10/2019 | Bellis | A47B 47/02 |
| 2006/0028177 A1 * | 2/2006 | Ferro | B62B 1/125 |
| | | | 320/114 |
| 2008/0079264 A1 * | 4/2008 | Serdynski | F02B 63/04 |
| | | | 290/36 R |
| 2012/0091961 A1 * | 4/2012 | Hani | B60L 53/65 |
| | | | 320/109 |
| 2012/0268067 A1 * | 10/2012 | Poulsen | B60L 53/14 |
| | | | 320/109 |
| 2014/0055083 A1 * | 2/2014 | Moribe | B60L 53/18 |
| | | | 320/107 |
| 2015/0028811 A1 | 1/2015 | Krammer et al. | |
| 2016/0280417 A1 * | 9/2016 | Skvorecz | B65D 7/20 |
| 2018/0086216 A1 | 3/2018 | Rodriguez | |

(Continued)

FOREIGN PATENT DOCUMENTS

| | | |
|---|---|---|
| JP | 2010283946 A | 12/2010 |
| JP | 2019193325 A | 10/2019 |

*Primary Examiner* — Amy J. Sterling
(74) *Attorney, Agent, or Firm* — THE WEBB LAW FIRM

(57) ABSTRACT

A stand for a charger includes an attachment portion attachable and detachable to and from the charger and a leg portion configured to be capable of supporting the charger with the charger being lifted up off the ground surface when the stand is attached to the charger.

7 Claims, 6 Drawing Sheets

(56) References Cited

U.S. PATENT DOCUMENTS

| | | | |
|---|---|---|---|
| 2018/0289210 A1* | 10/2018 | Skvorecz | A47J 36/34 |
| 2020/0328604 A1* | 10/2020 | Molle | B60L 53/30 |
| 2021/0376649 A1* | 12/2021 | Wu | H02J 7/00034 |
| 2022/0115886 A1* | 4/2022 | Casto | H02J 7/0063 |
| 2022/0190608 A1* | 6/2022 | Fuchs | H02J 7/0045 |

* cited by examiner

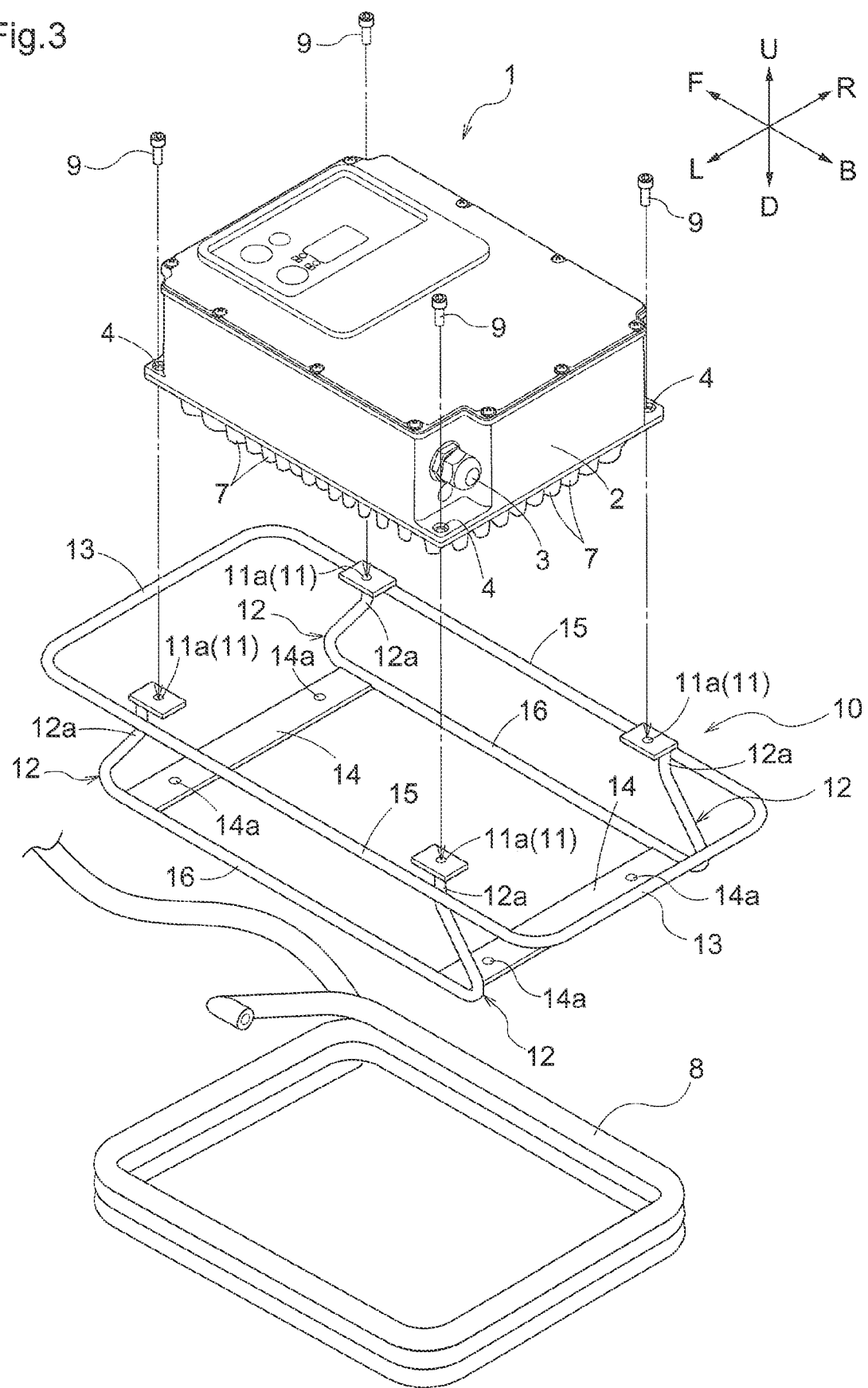

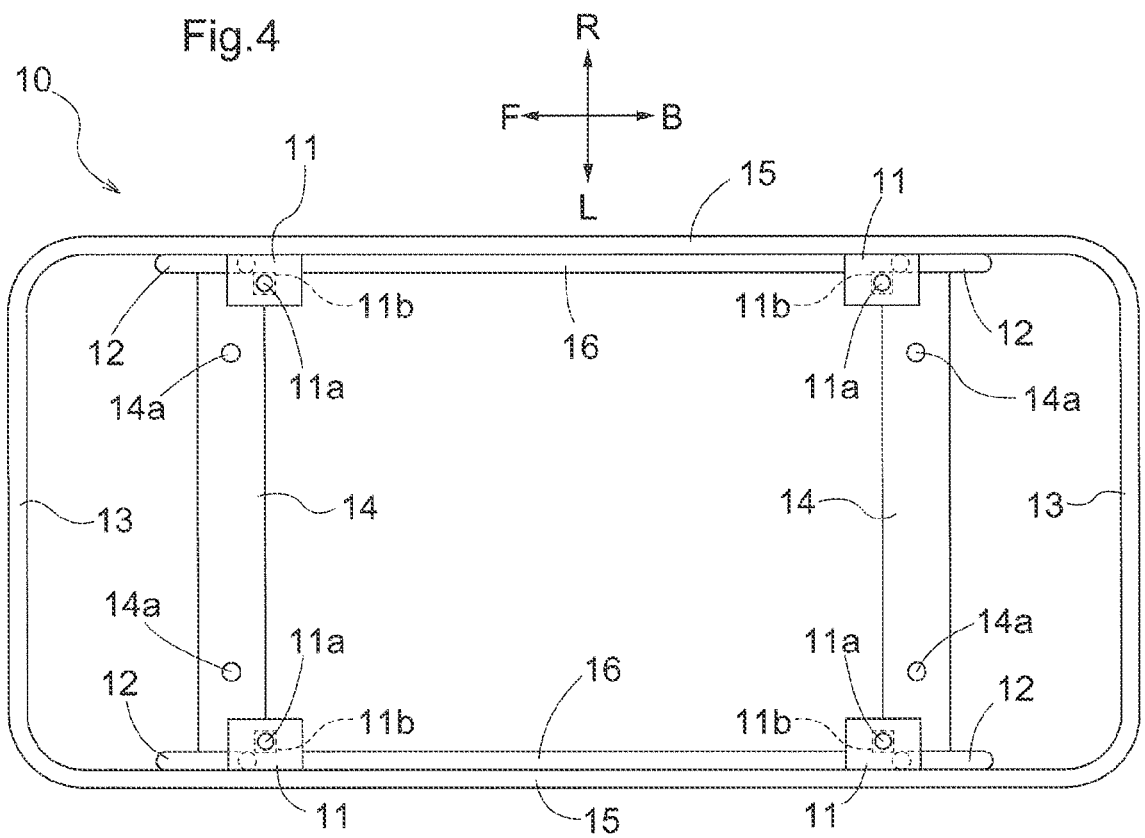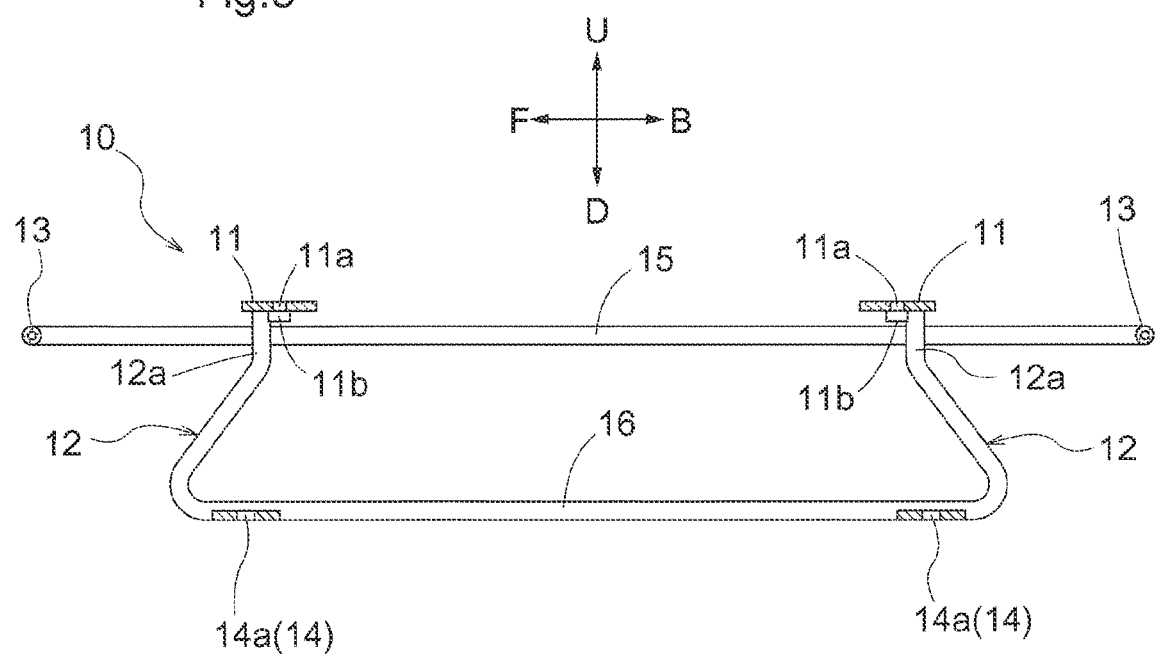

STAND FOR CHARGER

CROSS-REFERENCE TO RELATED APPLICATION

This application claims priority to Japanese Patent Application No. 2021-002845 filed Jan. 12, 2021, the disclosure of which is hereby incorporated by reference in its entirety.

BACKGROUND OF THE INVENTION

1. Field of the Invention

The present invention relates to an apparatus for assisting a charging operation by a charger used for charging a battery of e.g. a riding electrically powered work vehicle.

2. Description of the Related Art

In an electrically powered work vehicle or the like, there is employed a relatively large battery. So, a charger used for charging such battery tends to be large also. With such relatively large charger, the charger generates heat in association with a charging operation. Thus, there is known a charger equipped with a cooling fan, as disclosed in JP2019-193325A.

In JP2019-193325A, a charging operation is carried out with placing the charger directly on the ground surface. Thus, there is a need for an apparatus configured to assist cooling of the charger.

Then, there is proposed a stand for a charger having the following configuration.

SUMMARY OF THE INVENTION

A stand for a charger (may be referred to as a "charger stand" hereinafter), comprising:

an attachment portion attachable/detachable to/from the charger; and a leg portion configured to be capable of supporting the charger with the charger being lifted up off the ground surface when the stand is attached to the charger.

With the above-described configuration, by attaching the stand to the charger and placing these on a ground surface or a floor surface, etc., the charger can be supported as being lifted up off the ground surface, the floor surface, etc. by the stand. With this, there is formed a space between the charger and the ground surface or the floor surface or the like, and as ambient air flows through this space, cooling of the charger is promoted.

Further, in the case of a charger equipped with a cooling fan, as the charger is supported by the stand to be lifted up off the ground surface or the floor surface, flow of air generated by the cooling fan will hardly be impeded. Thus, it becomes possible to cause the cooling fan to function in an effective manner.

As described above, it has become possible to obtain a stand as an apparatus for assisting cooling of a charger.

Moreover, if the stand is attached to the charger, it is also possible to expect the stand to act as a "protector" for protecting the charger against collision with the ground surface, the floor surface, etc.

According to one preferred embodiment, the charger stand further comprises:

a handgrip portion protruding from an outer edge portion of the charger to the outside when the stand is attached to the charger.

With the above-described arrangement, when the stand is attached to the charger, a worker can hold or grip the handgrip portion, so that moving or transport of the charger can be carried out easily. In this case, since the handgrip portion protrudes to the outside from the outer edge portion of the charger, the worker will not be likely affected by the charger and can grip or hold the handgrip portion easily.

According to one preferred embodiment, in the charger stand, wherein:

at least two handgrip portions are provided; and when the stand is attached to the charger, one handgrip portion protrudes to the outside from one outer edge portion of the charger and the other handgrip portion protrudes to the outside from the other outer edge portion of the charger.

With the above-described arrangement, in the case of a relatively large charger or a relatively heavy charger, under the state of the stand being attached to such charger, e.g. two workers can hold the one handgrip portion and the other handgrip portion respectively. Thus, such relatively large charger or relatively heavy charger can be carried easily.

According to one preferred embodiment, the charger stand further comprises:

a harness holding portion capable of holding a harness of the charger wound therearound.

Here, the charger is often equipped with a long harness for e.g. feeding power to the battery.

With the above-described arrangement, under the state of the stand being attached to the charger, the harness may be wound around the harness holding portion for its storage in case e.g. no charging operation is to be effected. With this, the harness will hardly interfere with moving or transport of the charger.

According to one preferred embodiment, the charger stand further comprises:

a wall hook portion that can be attached to a wall.

With this arrangement, when the stand is detached from the charger, this stand can be hooked to the wall via the wall hook portion.

Further, under the state of the stand being attached to the charger, it is also possible to hook the stand to the wall together with the charger via the wall hook portion. Such state as above will be useful also when a charging operation is not possible with the charger being placed on the ground surface or the floor surface.

According to one preferred embodiment, in the charger stand, wherein:

there are provided at least two leg portions: and there is provided a left-right frame coupled between the right leg portion and the left leg portion.

With the above-described arrangement, as the right leg portion and the left leg portion are reinforced by the left-right frame, the strength of the stand can be improved.

According to one preferred embodiment, in the charger stand, wherein:

there are provided at least four leg portions; and there are provided a right front-rear frame coupled between the right front leg portion and the right rear leg portion and a left front-rear frame coupled between the left front leg portion and the left rear leg portion.

With the above-described arrangement, as the right front leg portion and the right rear leg portion are reinforced by the right front-rear frame and the left front leg portion and the left rear leg portion are reinforced by the left front-rear frame, the strength of the stand can be improved.

According to one preferred embodiment, in the charger stand, wherein:

there are provided:

a right front-rear frame coupled between an upper portion of the right front leg portion and an upper portion of the right rear leg portion;

a right front-rear frame coupled between a lower portion of the right front leg portion and a lower portion of the right rear leg portion;

a left front-rear frame coupled between an upper portion of the left front leg portion and an upper portion of the left rear leg portion; and a left front-rear frame coupled between a lower portion of the left front leg portion and a lower portion of the left rear leg portion.

With the above-described arrangement, the right front-rear frame reinforces the upper and lower portions of the right front leg portion as well as the upper and lower portions of the right rear leg portion, whereas the left front-rear frame reinforces the upper and lower portions of the left front leg portion as well as the upper and lower portions of the left rear leg portion. Thus, the strength of the stand can be improved.

BRIEF DESCRIPTION OF THE DRAWINGS

FIG. 3 is an exploded perspective view of the stand, the charger and a harness, FIG. 4 is a plan view of the stand, FIG. 5 is a side view of the stand.

DETAILED DESCRIPTION OF THE PREFERRED EMBODIMENTS

FIGS. 1 through 10 show a stand 10 for a charger 1. This charger 1 is a charger for use in e.g. charging a battery as a power source of e.g. an electrically powered riding grass mower (an example of "electrically powered work vehicle"). In FIGS. 1 through 10, a sign F denotes the front direction, a sign B denotes the rear direction, a sign U denotes the upper direction, a sign D denotes the lower direction, a sign R denotes the right direction and a sign L denotes the left direction, respectively.

(Configuration of Charger)

Figure 1:
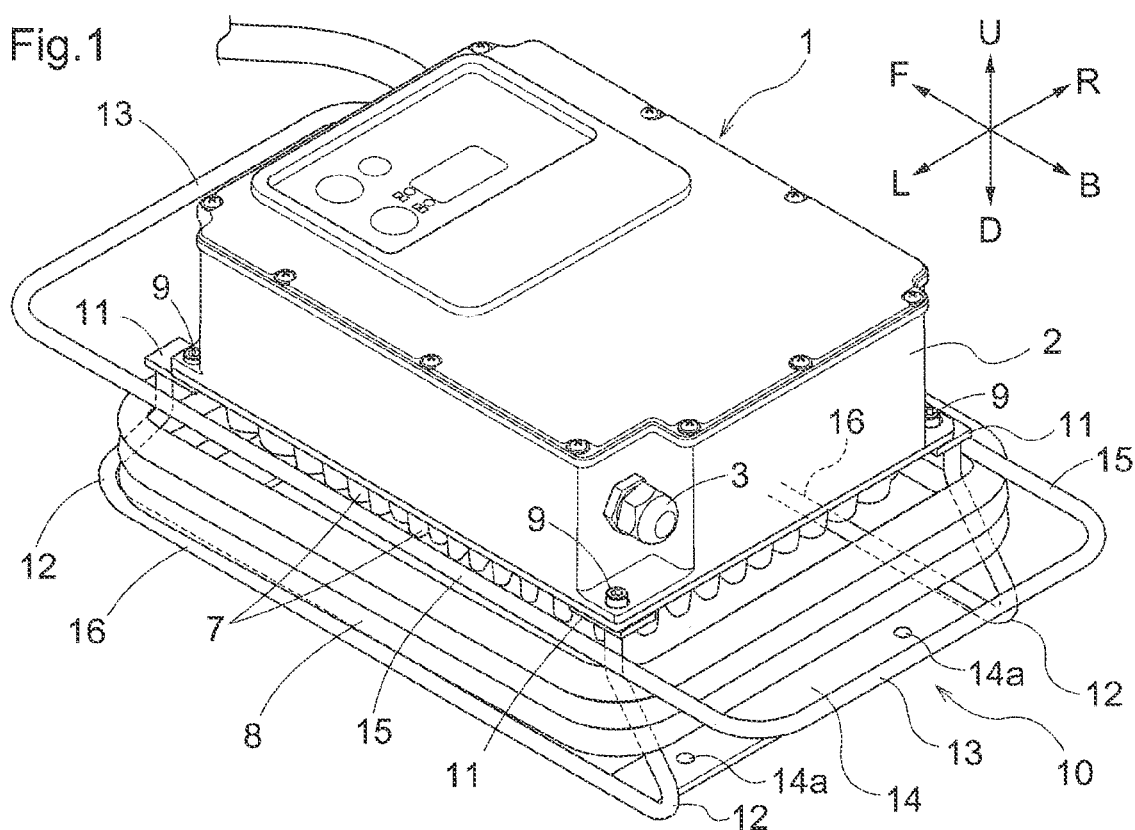
FIG. 1 is a perspective view showing a stand under its state of being attached to a charger.
Figure 2:
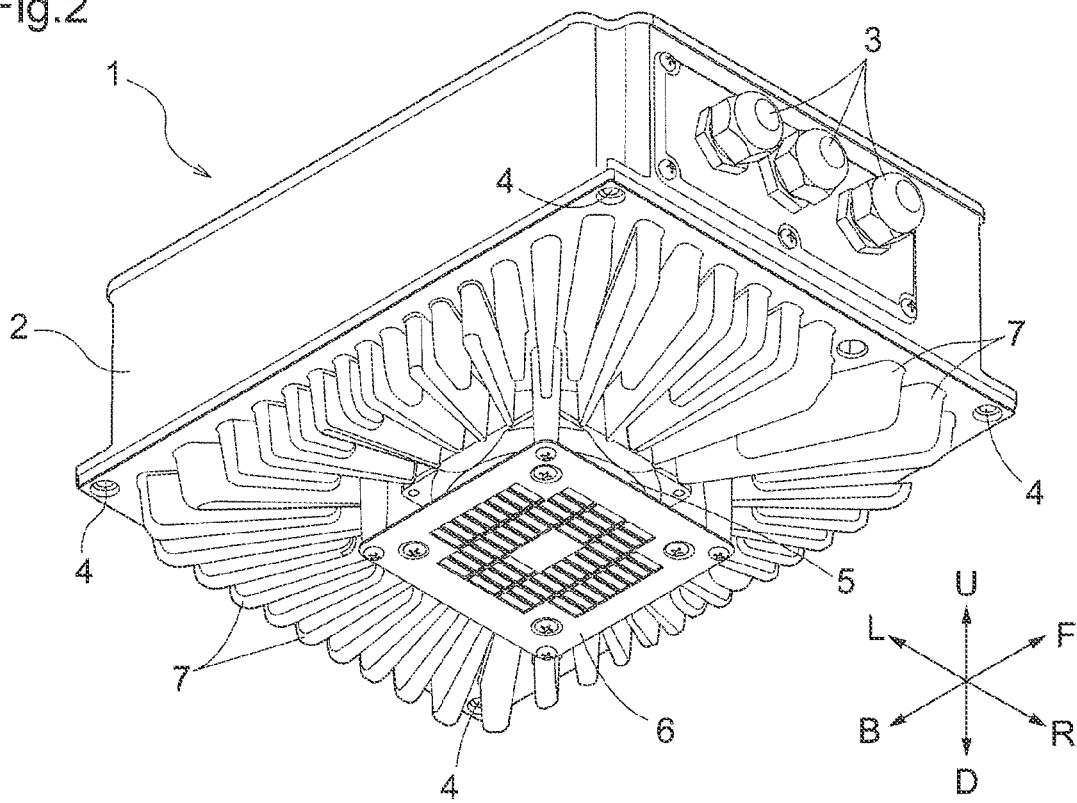
FIG. 2 is a perspective view of the charger.

FIGS. 1, 2 and 3 show the charger 1. This charger 1 has a cubic-shaped main body 2. Terminals 3 are provided in the front portion and the rear portion of the main body 2. A harness 8 for connecting a battery (not shown) etc. is to be connected to the terminals 3.

Opening portions 4 for attachment are provided at the right front portion and the left front portion as well as at the right rear portion and the left rear portion of the main body 2. A cooling fan 5 is provided under a downward orientation in the lower portion of the main body 2. A protection cover 6 is provided for protecting the cooling fan 5 from the lower side thereof. A number of heat discharging fins 7 are provided on the lower portion of the main body 2 radially around the cooling fan 5.

(Configuration of Stand)

FIGS. 3, 4 and 5 show the stand 10 for the charger 1. The stand 10 includes attachment portions 11, leg portions 12, handgrip portions 13, left and right frames 14 and front-rear frames 15, 16.

Two round pipe members or round bar members are bent in the form of a channel as seen in a side view. By the front portions and the rear portions of the channel-like two members, the right front leg portion 12, the left front leg portion 12, the right rear leg portion 12 and the left rear leg portion 12 are formed. Each leg portion 12 is bent in such a manner that the lower portion of the leg portion 12 protrudes more forwardly (rearwardly) than the upper portion of this leg portion 12, and the upper portion of the leg portion 12 forms a harness holding portion 12a.

The intermediate portion of the channel-like right member described above forms a right front-rear frame 16 which is coupled between a lower portion of the right front leg portion 12 and a lower portion of the right rear leg portion 12. The intermediate portion of the channel-like left member described above forms a left front-rear frame 16 which is coupled between a lower portion of the left front leg portion 12 and a lower portion of the left rear leg portion 12.

Two left-right frames 14 in the form of flat plates are provided. The front left-right frame 14 is coupled between front portions of the right and left front-rear frames 16. Namely, the front left-right frame 14 is coupled between the lower portion of the right front leg portion 12 and the lower portion of the left front leg portion 12.

The rear left-right frame 14 is coupled between rear portions of the right and left front-rear frames 16. Namely, the rear left-right frame 14 is coupled between the lower portion of the right rear leg portion 12 and the lower portion of the left rear leg portion 12. The front and rear left-right frames 14 define openings. These openings form wall hook portions 14a.

The attachment portion 11 is constituted of a flat plate. There are provided such four attachment portions 11. An attachment opening portion 11a is provided in each attachment portion 11. An attachment nut 11b is coupled to the lower face portion of the attachment portion 11. The attachment portion 11 is coupled to the upper end portion of the leg portion 12.

A round pipe member or a round bar member is bent into the shape of a rectangle as seen in a plan view. The rectangular member is coupled to the harness holding portions 12a of the four leg portions 12. The front portion and the rear portion of the rectangular member form front and rear handgrip portions 13 respectively.

In this case, the front handgrip portion 13 forms the front left-right frame which is coupled between the upper portion of the right front leg portion 12 and the upper portion of the left front leg portion 12. The rear handgrip portion 13 forms the rear left-right frame which is coupled between the upper portion of the right rear leg portion 12 and the upper portion of the left rear leg portion 12.

The right portion of the above-described rectangular member forms the right front-rear frame 15 which is coupled between the upper portion of the right front leg portion 12 and the upper portion of the right rear leg portion 12. The left portion of the above-described rectangular member forms the left front-rear frame 15 which is coupled between the upper portion of the left front leg portion 12 and the upper portion of the left rear leg portion 12.

(Use State of Stand)

When the stand 10 is to be attached to the charger 1, as shown in FIGS. 1, 2 and 3, the lower portion of the charger 1 is inserted between the right and left front-rear frames 15 in such a manner to place the opening portions 4 of the charger 1 (main body 2) on the attachment portions 11.

Then, bolts 9 are inserted into the opening portions 11a of the attachment portions 11 via the opening portions 4 of the charger 1 (main body 2). Then, the bolts 9 are fastened to the nuts 11b of the attachment portions 11. With this, the attachment portions 11 are attached to the charger 1 and the stand 10 is attached to the charger 1.

Under the state of the stand 10 being attached to the charger 1, by placing the stand 10 (leg portions 12) onto the ground surface, a floor surface, etc., the charger 1 can be supported as being lifted off the ground surface or the floor surface by the leg portions 12.

Thus, as a free space is formed between the charger 1 and the ground surface or the floor surface, ambient air will flow through this space, whereby heat discharging by the heat discharging fins 7 of the charger 1 (main body 2) is promoted. Namely, since the flow of air generated by the cooling fan 5 is hardly impeded, cooling of the charger 1 is promoted.

When the stand 10 has been attached to the charger 11, the front handgrip portion 13 protrudes forwardly (outwardly) from the front portion (outer edge portion) of the charger 1 (main body 2) and the rear handgrip portion 13 protrudes rearwardly (outwardly) from the rear portion (outer edge portion) of the charger 1 (main body 2).

In case the harness 8 is found excessively long at the time of charging operation or in case there is no charging operation to be effected, the harness 8 can be wound around the harness holding portions 12a of the four leg portions 12. With this, the harness 8 can be held.

In the stand 10, since each leg portion 12 is bent such that the lower portion of the leg portion 12 extends more forwardly (rearwardly) than the harness holding portion 12a of the leg portion 12, the harness 8 will not easily drop off the harness holding portion 12a of the leg portion 12.

When the stand 10 has been detached from the charger 1 with removal of the bolts 9, the wall hook portions 14a of the left-right frames 14 of the stand 10 may be hooked to e.g. a wall of a warehouse, so that the stand 10 may be kept hooked to the wall of the warehouse, etc.

When the stand 10 is attached to the charger 1, it is also possible to keep the stand 10 together with the charger 1 hooked to the wall of the warehouse or the like via the wall hook portions 14a of the left-right frames 14. This condition will be useful for e.g. a situation when charging operation is not possible with placing the charger 1 on the ground surface, the floor surface, etc.

First Alternative Embodiment of Invention

The stand 10 can be configured alternatively as will be explained next.

Figure 6:
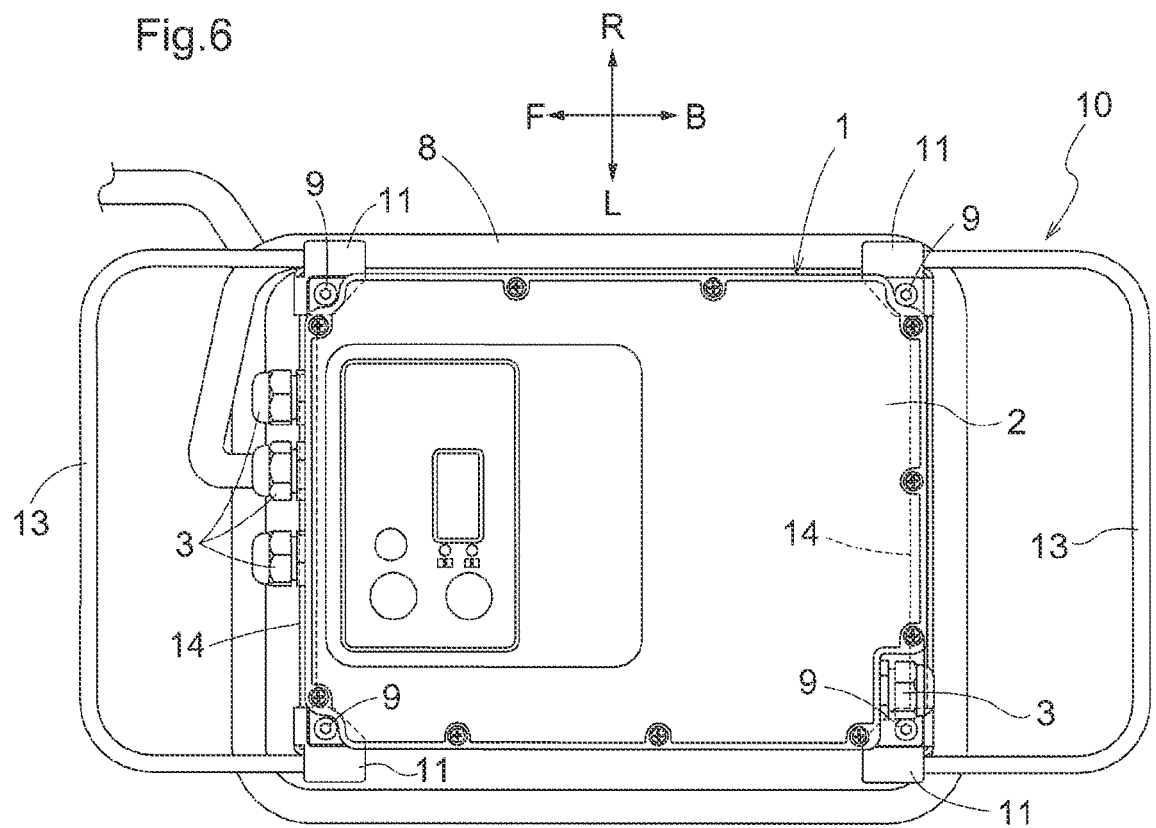
FIG. 6 is a plan view showing a state in which the stand is attached to the charger in a first alternative embodiment of the invention.
Figure 7:
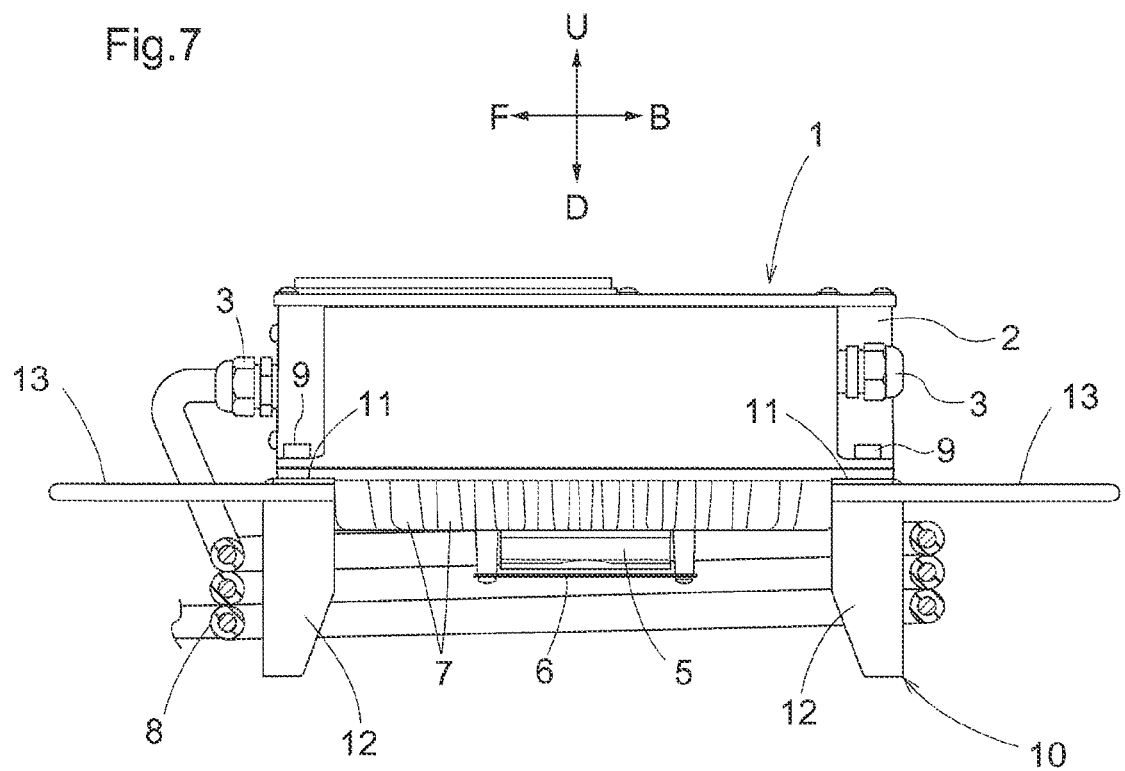
FIG. 7 is a side view showing the state in which the stand is attached to the charger in the first alternative embodiment of the invention.
Figure 8:
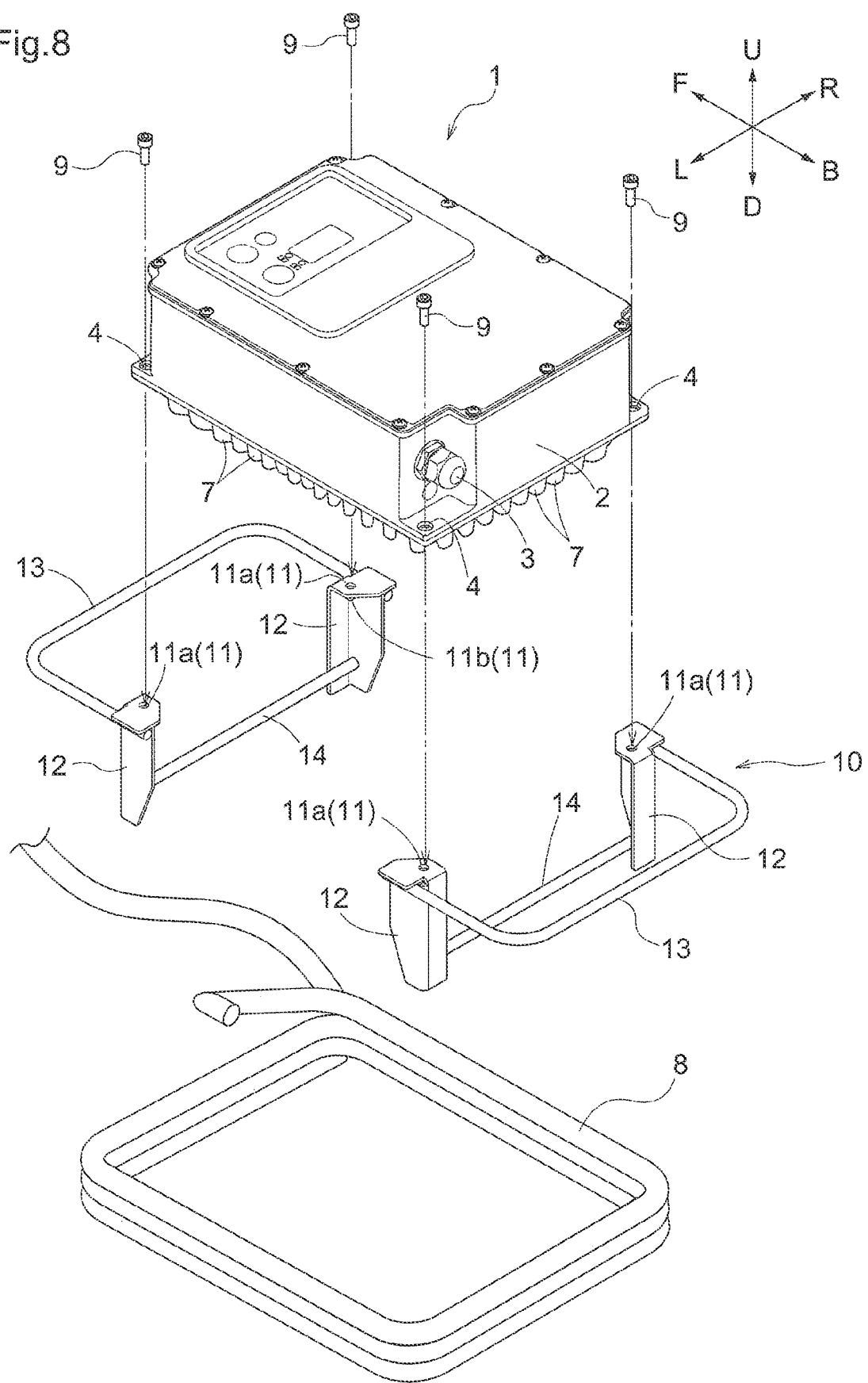
FIG. 8 is an exploded perspective view showing the stand, the charger and the harness in the first alternative embodiment of the invention.

As shown in FIGS. 6, 7 and 8, plate members are bent in the form of angle members to form the leg portions 12. The upper end portion of each leg portion 12 is bent laterally to form an attachment portion 11. The attachment portion 11 defines an opening portion 11a and to the lower face portion of the attachment portion 11, a nut 11b is coupled.

Two round pipe members or round bar members are bent into a channel shape as seen in a plan view to form front and rear handgrip portions 13. The front handgrip portion 13 is coupled between the upper portion of the right front leg portion 12 and its attachment portion 11 and the upper portion of the left front leg portion 12 and its attachment portion 11. The rear handgrip portion 13 is coupled between the upper portion of the right rear leg portion 12 and its attachment portion 11 and the upper portion of the left rear leg portion 12 and its attachment portion 11.

There are provided left-right frames 14 formed of two round pipe members or round bar members. The front left-right frame 14 is coupled between the lower portion of the right front leg portion 12 and the lower portion of the left front leg portion 12. The rear left-right frame 14 is coupled between the lower portion of the right rear leg portion 12 and the lower portion of the left rear leg portion 12.

In this case, the front handgrip portion 13 forms the front "left-right frame" which is coupled between the upper portion of the right front leg portion 12 and the upper portion of the left front leg portion 12. The rear handgrip portion 13 forms the rear "left-right frame" which is coupled between the upper portion of the right rear leg portion 12 and the upper portion of the left rear leg portion 12.

In the stand 10 shown in FIGS. 6, 7 and 8, the front-rear frames 15, 16 (see FIGS. 1 through 5) are not provided. A front structure component including the right front and left front leg portions 12, their attachment portions 11, the front handgrip member 13 and the front left-right frame 14 and a rear structure component including the right rear and left rear leg portions 12, their attachment portions 11, the rear handgrip portion 13 and the rear left-right frame 14 are provided separately.

With the above, the stand 10 is provided with the front and rear structure components described above. With this stand 10, like the one shown in FIGS. 1 through 5, the front and rear structure components can be attached separately to the charger 1 via the bolts 9.

In case the harness 8 is found excessively long at the time of charging operation or in case there is no charging operation to be effected, the harness 8 can be wound around the harness holding portions 12a of the four leg portions 12. With this, the harness 8 can be held.

Second Alternative Embodiment of Invention

The stand 10 can be configured alternatively as will be explained next.

Figure 9:
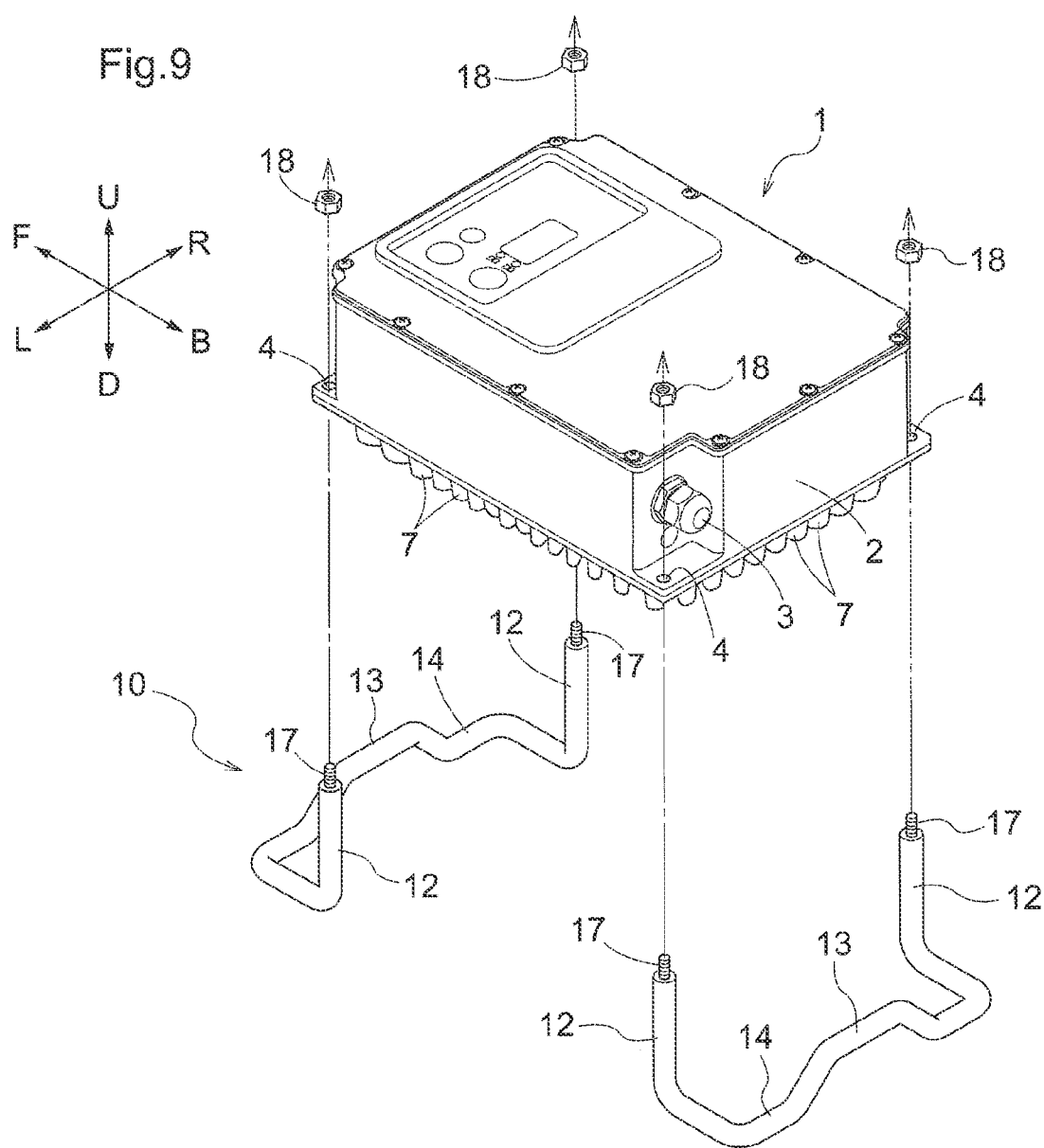
FIG. 9 is a exploded perspective view showing a stand and the charger in a second alternative embodiment of the invention.
Figure 10:
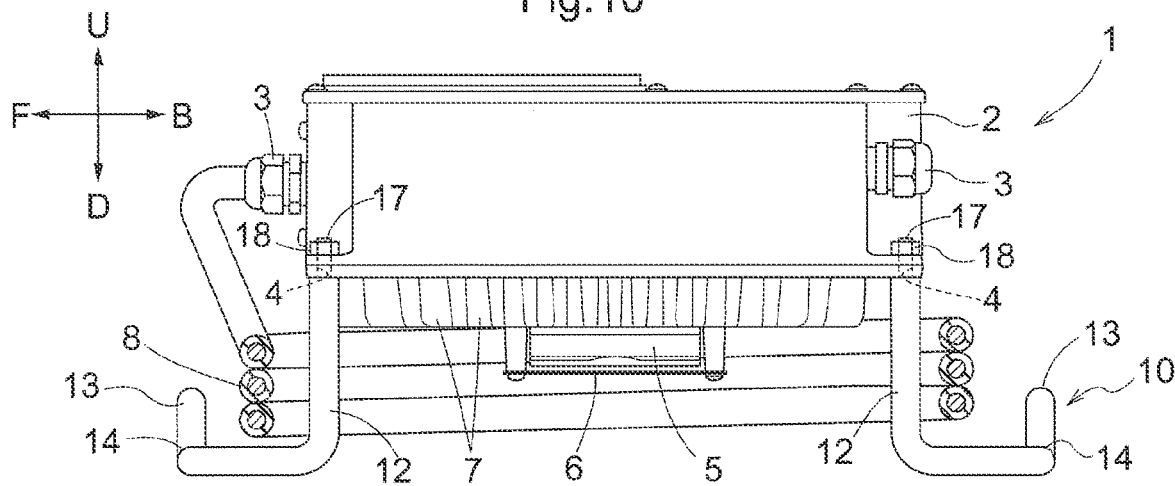
FIG. 10 is a side view showing a state in which the stand is attached to the charger in the second alternative embodiment of the invention.

As shown in FIG. 9 and FIG. 10, a round pipe member or a round bar member is bent to form a right front leg portion 12 and a left front leg portion 12. Lower portions of the right front and left front leg portions 12 are bent in the front and lateral directions to form a front left-right frame 14. An intermediate portion of the front left-right frame 14 is bent upwards to form a front handgrip portion 13. To upper end portions of the right front and left front leg portions 12, bolts 17 (corresponding to "attachment portions") are coupled upwardly.

Another round pipe member or round bar member is bent to form a right rear leg portion 12 and a left rear leg portion 12. Lower portions of the right rear and left rear leg portions 12 are bent in the rear and lateral directions to form a rear left-right frame 14. An intermediate portion of the rear left-right frame 14 is bent upwards to form a rear handgrip portion 13. To upper end portions of the right rear and left rear leg portions 12, bolts 17 (corresponding to "attachment portions") are coupled upwardly.

In the stand 10 shown in FIGS. 9 and 10, the front-rear frames 15, 16 (see FIGS. 1 through 5) are not provided. A front structure component including the right front and left front leg portions 12, the bolts 17, the front handgrip member 13 and the front left-right frame 14 and a rear structure component including the right rear and left rear leg portions 12, the bolts 17, the rear handgrip portion 13 and the rear left-right frame 14 are provided separately. With the above, the stand 10 is provided with the front and rear structure components described above.

When the stand 10 is to be attached to the charger 1, the bolts 17 will be inserted to the openings 4 of the charger 1 (main body 2) from the lower side and place the portions of the openings 4 of the charger 1 (main body 2) on the upper end portions of the leg portions 12, and nuts 18 will be fastened to the bolts 17. With this, the bolts 17 and the leg portions 12 are attached to the charger 1 and the stand 10 is attached to the charger 1.

In case the harness 8 is found excessively long at the time of charging operation or in case not charging operation is to be effected, the harness 8 can be wound around the harness holding portions 12a of the four leg portions 12. With this, the harness 8 can be held.

Third Alternative Embodiment of Invention

In the foregoing embodiments (first embodiment) and (second alternative embodiment), at the upper portions of the four leg portions 12, there may be formed recesses into which the harness 8 can be fitted or hook-like members to which the harness 8 can be hooked, thus forming the "harness holding portion 12a".

Fourth Alternative Embodiment of Invention

In the foregoing embodiments (first embodiment) through (third alternative embodiment), there may be provided the right front-rear frame 15, 16 (see FIGS. 1-5) coupled between the right front leg portion 12 and the right rear leg portion 12. And, there may be provided also the left front-rear frame 15, 16 (see FIGS. 1-5) coupled between the left front leg portion 12 and the left rear leg portion 12.

In this case, at front and rear intermediate portions of the right and left front-rear frames 15, 16 (see FIGS. 1-5), separate leg portions 12 may be coupled to provide the stand 10 with six leg portions 12.

Fifth Alternative Embodiment of Invention

In the stand 10 shown in FIGS. 1 through 5 and in the foregoing embodiment (fourth alternative embodiment of the invention), separate or additional right and left handgrip portions 13 may be coupled to the right and left front-rear frames 15, 16 (see FIGS. 1-5). With this, four handgrip portions 13 are provided in the stand 10.

Sixth Alternative Embodiment of Invention

In the stand 10 shown in FIGS. 1 through 5 and in the foregoing embodiment (fourth alternative embodiment of the invention), it may be arranged such that the right front-rear frame 15, 16 (see FIGS. 1-5) forms the right handgrip portion 13 by forming the right front-rear frame 15, 16 (see FIGS. 1-5) to protrude to the right side (outer side) from the right portion (outer edge portion) of the charger 1 (main body 2) when the stand 10 is attached to the charger 1.

Similarly, it may be arranged such that the left front-rear frame 15, 16 (see FIGS. 1-5) forms the left handgrip portion 13 by forming the left front-rear frame 15, 16 (see FIGS. 1-5) to protrude to the left side (outer side) from the left portion (outer edge portion) of the charger 1 (main body 2) when the stand 10 is attached to the charger 1.

With the above-described arrangements, four handgrip portions 13 are provided in the stand 10.

Seventh Alternative Embodiment of Invention

In the foregoing embodiment (first embodiment) through (third alternative embodiment), either one of the front structure component including the right front and left front leg portions 12 and their attachment portions 11, the front handgrip member 13 and the front left-right frame 14 and the rear structure component including the right rear and left rear leg portions 12, and their attachment portions 11, the rear handgrip portion 13 and the rear left-right frame 14 may be omitted, so that the stand 10 may be formed of either the front structure component or the rear structure component.

According to this configuration, the stand 10 is provided with two leg portions 12 and two attachment portions 11. In the state of the stand 10 being attached to the charger 1, when the stand 10 (leg portions 12) is placed on the ground surface or the floor surface or the like, the rear portion (front portion) of the charger 1 too is placed on the ground surface or the floor surface or the like. Thus, the charger 11 will assume a forwardly lifted (rearwardly lifted) posture.

Eighth Alternative Embodiment of Invention

In the stand 10 shown in FIGS. 1-5, the right front-rear frame 16 may be considered as a "leg portion 12" provided between the right front leg portion 12 and the right rear leg portion 12. Similarly, the left front-rear frame 16 may be considered as a "leg portion 12" provided between the left front leg portion 12 and the left rear leg portion 12. With this, the stand 10 will be provided with total of six or more leg portions 12.

From another point of view, the right front leg portion 12, the right rear leg portion 12 and the right front-rear frame 16 may be considered together as one "leg portion 12". Similarly, the left front leg portion 12, the left rear leg portion 12 and the left front-rear frame 16 may be considered together as one (another) "leg portion 12". In this case, the stand 10 will be provided with two leg portions 12.

Ninth Alternative Embodiment of Invention

The present invention is applicable not only to a charger 1 for a battery of an electrically powered grass mower, but also to a charger 1 for a battery of any other electrically powered work vehicle, a charger 1 for a battery of any utility implement such as an electrically powered chainsaw, an electrically powered saw, etc.

The invention claimed is:
1. A stand for a charger, comprising:
   at least one attachment portion attachable and detachable to and from the charger;
   a left leg portion and a right leg portion configured to support the charger so that the charger is lifted up off a ground surface when the stand is attached to the charger; and
   a left-right frame coupled between the right leg portion and the left leg portion,
   wherein the at least one attachment portion is at an end of at least one of the right leg portion or the left leg portion.

2. The charger stand of claim 1, further comprising a handgrip portion protruding from an outer edge portion of the charger to an outside when the stand is attached to the charger.

3. The charger stand of claim 2, wherein:
at least two handgrip portions are provided; and
when the stand is attached to the charger, one handgrip portion protrudes to the outside from one outer edge portion of the charger and the other handgrip portion protrudes to the outside from the other outer edge portion of the charger.

4. The charger stand of claim 1, further comprising:
a harness holding portion capable of holding a harness of the charger wound therearound.

5. The charger stand of claim 1, further comprising:
a wall hook portion configured to be attached to a wall.

6. The charger stand of claim 1, wherein:
there are provided at least four leg portions; and
there are provided a right front-rear frame coupled between a right front leg portion and a right rear leg portion and a left front-rear frame coupled between a left front leg portion and a left rear leg portion.

7. The charger stand of claim 6, wherein:
the right front-rear frame is coupled between an upper portion of the right front leg portion and an upper portion of the right rear leg portion;

a right front-rear frame is coupled between a lower portion of the right front leg portion and a lower portion of the right rear leg portion;

a left front-rear frame is coupled between an upper portion of the left front leg portion and an upper portion of the left rear leg portion; and a left front-rear frame is coupled between a lower portion of the left front leg portion and a lower portion of the left rear leg portion.

* * * * *